United States Patent [19]

Kadomura

[11] Patent Number: 5,599,742
[45] Date of Patent: Feb. 4, 1997

[54] INTERCONNECTION FORMING METHOD

[75] Inventor: Shingo Kadomura, Kanagawa, Japan

[73] Assignee: Sony Corporation, Tokyo, Japan

[21] Appl. No.: 933,027

[22] Filed: Aug. 20, 1992

[30] Foreign Application Priority Data

Aug. 29, 1991 [JP] Japan .................................. 3-244523
Sep. 2, 1991 [JP] Japan .................................. 3-246450
Jun. 2, 1992 [JP] Japan .................................. 4-141527

[51] Int. Cl.$^6$ ................................................. H01L 21/467
[52] U.S. Cl. ...................... 437/194; 437/197; 437/198; 437/199; 437/245; 437/229; 156/643.1; 156/646.1
[58] Field of Search .................................. 437/194, 197, 437/198, 199, 245, 246, 228, 229; 156/646.1, 643.1

[56] References Cited

U.S. PATENT DOCUMENTS

| 4,208,241 | 6/1980 | Harshbarger et al. |
| 4,622,285 | 11/1986 | Ahne. |
| 5,314,576 | 5/1994 | Kadomura ............................. 156/655 |
| 5,326,431 | 7/1994 | Kadomura ............................. 156/659.1 |

FOREIGN PATENT DOCUMENTS

| 0260906 | 3/1988 | European Pat. Off. |
| 0186296 | 6/1988 | European Pat. Off. |
| 0427327 | 5/1991 | European Pat. Off. |
| 0489179 | 6/1992 | European Pat. Off. |
| 55-123125 | 9/1980 | Japan. |
| 59-22374 | 5/1984 | Japan. |
| 2042488 | 9/1980 | United Kingdom. |

OTHER PUBLICATIONS

Mikulski et al, "Synthesis and Structure of Metallic Polymeric Sulfur Nitride, $(SN)_x$, and Its Precursor, Disulfur Dinitride, $S_2N_2$", *Journal of the American Chemical Society*, Oct. 29, 1975, pp. 6358–6363.

Yoshino et al, "Formation of Semiconductive Metal–Sulfide at Interface of $(SN)_x$–Metal Junction", *Japanese Journal of Applied Physics*, vol. 21, No. 8, Aug. 1982, pp. L507–L508.

Mikulski et al, "Synthesis and Structure of Metallic Polymeric Sulfur Nitride, $(SN)_x$, and Its Precursor, Disulfur Dinitride, $S_2N_2$", *Journal of the American Chemical Society*, vol. 97, No. 22, Oct. 29, 1975, pp. 6358–6363.

*Semiconductor World*, Apr. 1989, pp. 101–106. (Author & Title not provided).

*Semiconductor World*, Sep. 1990, pp. 126–130. (Author & Title not provided).

*Semiconductor World*, Oct. 1990, pp. 44–49. (Author & Title not provided).

(List continued on next page.)

*Primary Examiner*—George Fourson
*Assistant Examiner*—C. Everhart
*Attorney, Agent, or Firm*—Hill, Steadman & Simpson

[57] ABSTRACT

A method of forming interconnectors involves the passivation (surface protective) of aluminum interconnector patterns and connection hole surfaces without objectionable particle level problems. Under electrical discharge disassociation conditions, sulphur (S) is liberated and permits the formation of an anti-corrosive polythiazyl in a plasma generated by using gaseous sulphur and nitrogen containing compounds. For example, in order to prevent the exposure of an aluminum interconnector material layer to atmospheric air after it has been resist masked and etched, plasma CVD is used with a gas containing a mixture of $S_2F_2/H_2/N_2$, to form a protective film on the surfaces of the pattern. In this coated condition, after corrosion is prevented until such time as the next fabrication step which forms an interlayer insulation membrane is carried out. The protective film can be removed by heating the wafer to about 150° C. at which time the protective film readily sublimes or decomposes. Other application come in that, after a natural oxide film is removed from a contact hole surface, until an upper interconnector is formed, the above mentioned protective film is temporarily formed over the exposed surfaces to prevent the reformation of the natural oxide film.

33 Claims, 5 Drawing Sheets

OTHER PUBLICATIONS

*34th Applied Physics Related League Lecture Meeting* (1987 Annual Spring Meeting), vol. 2, p. 460, "Suggestion of Si Surface Anti–Oxidized Layer for Dry Process" E. Ikawa, et al.

Abstract of Japanese Published Application 5047720 of Feb. 26, 1993, *Patent Abstracts of Japan*, vol. 017, No. 340 [E1389] Jun. 28, 1993.

Abstract 582, Hara et al "Surface Cleaning for $SiH_4$–Reduced Selective Tungsten", *Extended Abstracts Fall Meeting, Seattle, Washington*, Oct. 14–19, 1990, vol. 90, No. 2, pp. 842–843.

INTERCONNECTION FORMING METHOD

BACKGROUND OF THE INVENTION

The present invention relates to a method of forming interconnections and more specifically to a method via which the surfaces of aluminum type material connectors and junctions can be protected from detrimental influences by oxygen and moisture in the surrounding environment immediately following etching, and thus enable the fabrication of highly reliable interconnectors in a multi-chamber fabrication device without incurring increases in production costs.

With the recent advent of VLSO, ULSI the demand for high accumulation and high performance semiconductor devices has induced the situation wherein, during the fabrication of the interconnector patterns, the chances for the various layers and surfaces of interconnector patterns to come into contact with the ambient atmosphere or with atmospheres which contain acidic substances and undergo chemical changes, has increased. One of these chemical changes takes the form of the surfaces of Al type material interconnector patterns, which are exposed immediately following the etching process which forms the same, to undergo so called "after corrosion" or for the exposed surfaces of contact and bore holes to develop a natural oxide film thereon.

The above mentioned after corrosion is mainly brought by corrosion which occurs after dry etching of aluminum type interconnector layers. An example of the mechanism involved is set forth on pages 101–106 of the monthly SEMICONDUCTOR WORLD of April 1989.

The dry etching of Al type interconnector layers is usually carried out using chlorine containing gases. For example, JP-B-59-22374 discloses the use of a gas containing a mixture of $BCl_3/Cl_2$. The effect of this usage is such that reaction products such as $AlCl_x$ and those which result from the decomposition of the etching gas become adsorbed at locations which are proximate the etching pattern. In addition to this adsorption, such products can be absorbed into the resist mask.

These chlorine based reaction products and decomposed etching gas are absorbed by air-borne moisture to form droplets of electrolyte which give rise to corrosion and eat away the aluminum. Further, the resist mask and the active types of chlorine react to form a carbon based polymer $CCl_x$ which forms an anisotropic protective side wall layer. However, in this instance the chlorine in the carbon based polymer acts as a source of harmful residual chlorine.

In connection with the above mentioned after corrosion, a measure against the stress migration in the Al based interconnector materials has been to add Cu (copper). However, this only results in worsening matters. That is to say, CuCl becomes one of the etching reaction products which also remains proximate the etched pattern due to the low vapor pressure which prevails after the etching. This CuCl is absorbed by the moisture and functions to provide chloride ions (electrolyte) while the aluminum and copper act as the electrodes of a battery cell.

In addition, during recent years, stringent semiconductor device design rules along with looking to the prevention of after corrosion, have amounted to factors which have brought about a reduction in the sole use Al based interconnector layers. By way of example, in order to prevent the separation of Al based interconnector layer and the silicon substrate, it is common to provide a barrier metal.

Further, in order to improve the precision of photolithography on the surfaces of the Al based interconnector layers, an amorphous silicon or TiON reflection preventing layer has been laminated. In this instance, as the etching of the layers of different contacting materials, exposes edge surfaces of the same, droplets which are formed in the atmospheric air, of course tend to provide a battery cell effect which tends to hasten the rate with which the aluminum is eaten away. Further, chlorine and chlorine containing materials can be enter and remain in micro sized cracks and the like in the different type material layers.

The mechanism via which the above mentioned after corrosion takes place is such that with the exception of fluorine, halogens such as bromine etc., provide essentially the same effect as chlorine and will be referred to generically in the instant disclosure simply as halogens.

In order to prevent after corrosion it is known to (a) use $CF_4$ and $CHF_3$ fluorocarbon gas for plasma cleaning, (b) use oxygen plasma ashing for the removal of side wall protective layers and resist masks, and (c) use $NH_3$ gas for plasma cleaning in combination with washing techniques.

Each of these measures is directed to the removal of residual halogens. That is to say, the reaction products which are produced when chlorine and bromine are replaced with fluorine, increases the vapor pressure and the residual halogens which are mainly included in the resist mask or side wall protective layers are removed by ashing; or the halogen containing materials are converted into inactive halogen containing materials such as ammonium halogens, or alternatively highly anti-corrosive layers of $AlF_3$ or $Al_2O_2$ are formed on the surfaces of the Al based interconnector layers, and thus attenuate after corrosion.

Nevertheless, none of the above provides a decisive effect.

On the other hand, a different approach to the removal of the residual halogens comes in that, after patterning the Al based interconnector layer, $CHF_3$ or the like gas is used to accumulate a carbon based polymer layer over the surface of the wafer. This is referred to as polymer passivation. By way of example, the 36th Applied Physics related League lecture meeting (1989 Annual Spring meeting) Volume 2 page 571, Subject No. 1p-L-4 and SEMICONDUCTOR WORLD October 1990 pages 44–49 (Press Journal Publishing Co.) it is disclosed that after the Al based interconnector layer etching is completed, immediately before over etching, via $CHF_3$ plasma deposition and etchback, the side walls of the Al based interconnector pattern are selectively covered with a side wall protective coating of carbon based polymer.

Originally, over etching was proposed as a technique for preventing inferior anisotropic formation, however its annexing effect also attenuates after corrosion. The fluorine from the $CHF_3$ substitutes with the residual halogen on the wafer or forms a carbon based polymer which prevents moisture from reaching the Al based interconnector layer, so that until the next fabrication step it is possible to extend the time before the next fabrication step need be carried out.

On the other hand, in the case of natural oxide films, in recent years the use of multi-interconnector layers in semiconductor device has lead a cross-up problem. As is commonly known, high quality complex semiconductor devices increase the area consumed by the interconnectors, and in order to prevent the size of the chip being increased it is necessary to use multiple interconnector layers.

In order to achieve the above mentioned multiple interconnector layers it is necessary to form electrical connections between the layers by etching contact and bore holes which extend between the various levels. After removing the resist mask used for the etching the interconnector the holes are filled as the interconnector layers are formed. In this process the wafer is transferred from the etching chamber to a ashing device which removes the resist mask. However, during the transfer the wafer is briefly exposed to the atmospheric air. Following the removal of the resist mask, the wafer is transferred to another process chamber (e.g. a sputtering chamber) and is again exposed to the atmospheric air.

During the period the wafer is exposed to the atmospheric air, the surfaces of the connector layers at the bottom of the connection holes are exposed to air and inevitably tend to form natural oxide films thereon. The natural oxide films cause the resistance of the contacts to increase.

During recent years as the aspect ratio of the contact holes has increased tungsten type metals have been selectively developed via CVD. However, the natural oxide films have either obstructed or induced abnormal development. Accordingly, it is essential that these oxide films be completely removed.

Previously, the so called wet method wherein a mist of HF buffer has been used to moisturize the surface of the substrate, has been widely used. However, this has then demanded washing and drying steps and has been troublesome. On the other hand, while the so called dry method wherein gaseous Hf is used, is being experimented with, various control problems have been encountered. Further, even if the natural oxide film is completely removed the problem that the wafer will again be exposed to air and the natural oxide film be reformed exists.

To overcome this latter mentioned problem various techniques have been investigated from various aspects including various hardware and process approaches.

First, in connection with the hardware approaches, a multi-chanber system has been proposed wherein a vacuum road-lock device has been developed and wherein a wafer handling unit is arranged to transfer the wafer between a plurality of surrounding process chambers. This wafer handling unit and each of the chambers are separated by a gate valve and thus arranged so that the wafer can be be moved from chamber to chamber without be exposed to atmospheric air. By way of example SEMICONDUCTOR WORLD Sept. 1990 pages 126–130 disclose a multichamber system in which tungsten interconnectors are formed.

On the other hand, in connection with the process approach, so called polymer passivation has been proposed wherein a carbon based polymer is formed over the interconnector surface to shut out any contact with atmospheric air. An example of this is set forth in 34th Applied Physics related League lecture meeting (1987 Annual Spring meeting) Volume 2 page 460 Subject No. 31p-P-6. In this example, after the natural oxide film is removed a carbon based polymer is induced to accumulate on the surface of the silicon substrate. Immediately before the next fabrication process, the polymer layer is removed using chlorine in an UV assisted etching.

However, with the above mentioned prior art approaches various problems have been encountered.

Firstly, in connection with the measures used to overcome after corrosion there are certain points which are not covered. Among these is the problem that when the carbon based polymer does not adequately provide a step coverage there are sites where moisture can penetrate. Further, when the resist mask and the carbon based polymer layer are both present, while a very effective protection is achieved, a problem is encountered in that during ashing a high temperature is applied, the formation of polymer requires the application of an incompatible low temperature which results in the optimal conditions being extremely difficult to achieve and give rise to the concern that polymer particle contamination might result. Furthermore, in the case the polymer is formed after the resist mask, the process is such that, in order to remove the polymer, the ashing procedure must be carried out a number of times and gives rise to the problem that the number of operations is increased.

In the case of the removal of the natural oxide film, while the use of multichamber system permits the various steps to be stably carried out in the appropriate atmosphere, and for the number of steps and chances of pollution to be minimized, the actual device itself is extremely large and in order to achieve the required high level processing, the running costs are high.

In addition to the above, especially in the instance the interconnector layer takes the form a doped silicon substrate, the use of a carbon based polymer induces the fear that carbon contamination will occur.

OBJECT AND SUMMARY OF THE INVENTION

An object of the present invention is to provide a method via which, without the use of large scale devices and without objectionable particle levels, effectively applies passivation to Al based interconnector patterns so that after corrosion of the exposed surfaces thereof and the reformation of natural oxide films are prevented.

The present invention is such that particle contamination of the surface of the wafer and carbon based contamination of silicon substrates do not occur and such that a sulphur nitride type compound is used to achieve passivation of the Al based interconnector patterns and substratum interconnector material layers.

The above mentioned sulphur nitride type compound $(SN)_x$ based material is know per se as a polythiazyl and is documented some time ago in J. Am. Chem. Soc., Vol. 97, pages 6358–6363 (1975) as being an inorganic electrically conductive polymer which at normal pressures is stable at 208° C. while under reduced pressures is stable to 140°–150° C. The crystalline substance at room temperature and in a 1 atmos. dry oxygen atmosphere, or alternatively in a moist oxygen atmosphere, undergoes no change when exposed for a period of 6 hours and therefore exhibits an extremely high resistant to oxidation. Therefore, after the natural oxide film has been removed and the substratum interconnector material layer covered with $(SN)_x$ the reformation of the natural oxide layer can be completely prevented. Further, if the $(SN)_x$ is heated to 140°–150° C. under a reduced pressure it can be induced to readily decompose and can be completely removed without leaving any particulate contamination behind.

According to the present invention, after etching the Al type interconnector pattern is treated with the sulphur nitride type compound material.

That is to say, after etching of the Al based interconnector layer using resist mask to form the interconnector pattern, at least the side walls of the interconnector pattern are coated with a sulphur nitride type compound $(SN)_x$ layer. In this case the resist mask is left as it is while only the exposed side walls of the pattern are coated and therefore at least this portion is subject to passivation. As the sulphur nitride type compound layer is formed, even if the wafer is exposed to atmospheric air before the next step of the fabrication process (e.g. the formation of an interlayer insulation membrane) the exposed surfaces of the interconnector pattern are covered with a protective covering and prevented from undergoing any detrimental changes such as after corrosion. Therefore the present invention enables the prevention of after corrosion to be greatly improved.

Further, as the sulphur nitride type compound layer can be removed simply by heating (induced to decompose), it is not necessary to use oxygen plasma ashing as in the case of carbon based polymer and this feature defines one of the major merits of the invention.

In the case wherein materials which are based on sulphur nitride type compounds are used for passivation purposes, after the etching process is completed, the resist mask can be removed while still being effective. In this connection, the removal of the resist mask is such that the residual halogens which tend to be absorbed therein, are removed with the mask.

It should be noted that sulphur nitride based material layers can be formed using plasma CVD. That is to say, a gas containing a mixture of sulphur containing compounds and nitrogen containing compounds can be subject to electrical discharge disassociation under lower than room temperature plasma conditions so that a sulphur nitride type material layer can be induce to accumulate over the surface of the wafer. At this time, the sulphur nitride material layer can be induced under suitably set discharge conditions so as to cover the whole surface of the wafer, or alternatively, can be selectively induced to accumulate on the pattern side walls using perpendicular ion irradiation.

Sulphur containing materials which can be used in the above include $S_2F_2$, $SF_2$, $SF_4$, $S_2F_{10}$ and $H_2S$. The first four of these can be generically referred to a fluorosulphides and are such that the S/F ratio (ratio of the sulphur atoms to the fluorine atoms in the molecule) is relatively large, and different from the commonly used etching gas $SF_6$, and so that under electrical discharge disassociation conditions the liberation in a plasma enables the release of the sulphur. $H_2S$ also enables this to occur.

If this plasma CVD process is simply considered, the nitrogen and the sulphur which are released in the discharge disassociation induced plasma first form a thiazyl (S≡N).

Nitrogen monoxide resembles oxygen in that it includes unpaired electrons and readily permits polymerization and the formation of $(SN)_2$. $(SN)_2$ decomposes at about 30° C. but at approximately 20° C. is readily polymerized to form $(SN)_4$ and thus leads to the formation of $(SN)_x$. $(SN)_4$ has a melting point of 178° C. and a decomposition temperature of 206° C.

It should be noted that the F* and H* radicals in the plasma readily combines with the sulphur (S) atom of the above $(SN)_x$ to form either thiazole fluoride or thiazole hydride.

Further, according to the conditions it is possible that compounds such as $S_4N_2$ (melting point 23° C., $S_{11}N_2$ (melting point 150°–155° C.), $S_{15}N_2$ (melting point 137° C.), $S_{16}N_2$ (melting point 122° C.) which exhibit an imbalance in the number of sulphur (S) atoms and nitrogen atoms (N) are formed and assume annular sulphur nitride type formations. Alternatively, on the other hand is possible for the nitrogen atoms combine with the hydrogen atoms and $S_7NH$ (melting point 113.5° C.), $1,3$-$S_6(NH)_2$ (melting point 130° C.), $(NH)_2$ (melting point 133° C.), $1,5$-$S_6(NH_3)$ (melting point 155° C.), $1,3,5$-$S_5(NH)_3$ (melting point 124° C.), $1,3,6$-$S_6(NH)_3$ (melting point 131° C.) or $S_4(NH)_4$ (melting point 145° C.) imido type compounds, to be formed.

In any event, if the temperature of the wafer is reduced below room temperature the above type of sulphur nitride compounds come into existence. Further if the wafer is heated ready decomposition or sublimation occurs, and thus renders it possible to leave the wafer surface free of particle contamination.

The present invention is further such that it is possible to apply passivation to the exposed walls/surfaces of contact holes using this type of sulphur nitride compound. That is to say, if the surfaces of the substratum interconnector material layer which are apt to come into contact with the atmospheric air, are coated with the above described type of $(SN)_x$ based sulphur nitride layer, after the natural oxide film is removed from the surfaces of the substratum interconnector material layer, air is shut out and the reformation of the natural oxide layer similarly prevented. In addition, the protective sulphur nitride layer can be readily induced to sublime and/or decompose and thus be removed, simply by heating the wafer.

Alternatively, if optimal etching conditions are used, it is possible to use competing processes to remove the natural oxide film and to induce the protective film to accumulate at the same time. This technique eliminates one of the fabrication steps which are required.

In this case also, the sulphur nitride type compound layer can be formed using a plasma CVD type principle. In this case, it should be noted that it is possible to select among a wider group of compounds than in the case wherein passivation is applied to Al type material interconnector patterns. That is to say, in addition to $H_2S$ it is possible to use $S_3Cl_2$, $S_2Cl_2$, $SCl_2$ sulphur chlorides and $S_3Br_2$, $S_2Br_2$ and $SBr_2$ sulphur bromides. Viz., the spot light is not on the object of preventing after corrosion it does not increase the residual chlorine and bromine to any degree. In certain cases a fluorine replacement effect may be expected and in such instances it may be preferred to use either sulphur fluoride or $H_2S$. In connection with this, while the object is removing the natural oxide film from the lower surfaces of the connection holes, it may happen that not only the surfaces of the substratum interconnector layer are exposed and, even if, by way of example, an Al type material layer or an Al type interconnector layer is present, it is possible to use sulphur chlorides and bromides.

As will be appreciated, the above described invention is such that, after etching of an Al type material layer, after corrosion preventing passivation, or alternatively, the prevention of the reformation of a natural oxide layer on the surfaces of contact holes via the passivation of such surfaces is possible by accumulating a sulphur nitride type material layer thereon.

As different from the prior art carbon based type polymer passivation, the problem of contamination by residual particles is eliminated. Further, the above described sulphur nitride type material can be readily removed simply by heating, and therefore eliminates the need for special equipment for the same.

Further, while the sulphur nitride protective layer remains on the wafer it is possible to transfer the wafer in a manner which brings the same into contact with the atmospheric air and thus eliminates the need for the above mentioned type of multichamber system, and therefore prevents the need for large scale equipment and reduces costs.

The present invention enables highly effective production of highly reliable, high density, high quality semiconductor devices wherein stringent design rules are applied.

BRIEF DESCRIPTION OF THE DRAWINGS

FIGS. 1a–1d are cross-sectional views showing the fabrication process via which passivation is applied to the aluminum based material interconnector pattern, and wherein: FIG. 1a shows the condition wherein a resist mask is formed on top of the aluminum type material interconnector layer, FIG. 1b shows the state wherein etching to form the interconnector pattern has been carried out, FIG. 1c shows the state wherein the upper surface of the wafer has been coated with a protective sulphur nitride film, and FIG. 1d shows the state immediately prior the next fabrication step wherein resist mask and sulphur nitride membrane are removed;

FIGS. 2a–2d are cross-sectional views which show another process via which the passivation of the interconnector pattern is applied and wherein FIG. 2a shows an interconnector pattern which has been formed by using a resist mask and etching, FIG. 2b shows the condition wherein the resist mask has been removed, FIG. 2c shows the condition wherein the upper surface of the wafer is covered with a protective sulphur nitride film, and FIG. 2d shows the condition wherein the protective film has been removed immediately prior the next fabrication step;

FIGS. 3a–3e are cross-sectional views which show process via which passivation of the lower portions of a contact hole is applied in accordance with the present invention, and wherein: FIG. 3a shows the state wherein a $SiO_x$ natural oxide layer has appeared on the exposed surface of a contact hole bottom, FIG. 3b shows the state wherein the natural oxide layer is removed together with the formation of a S protective layer on the lower surface of the contact hole, FIG. 3c shows the condition wherein the upper surface of the wafer is covered with a protective sulphur nitride layer using plasma disposition, FIG. 3d shows the condition wherein the protective sulphur nitride and S layers are removed by heating the wafer, and FIG. 3e shows the state wherein a W plug is formed using a selective CVD technique;

FIGS. 4a and 4b are cross-sectional views which show another process via which passivation is applied to the bottom of a contact hole, and wherein: FIG. 4a shows the state wherein a $SiO_x$ natural oxide film has formed on the exposed surface of doped region formed in a silicon substrate, and FIG. 4b shows the condition wherein the natural oxide film is removed and at the same time the upper surface of the wafer is coated with a sulphur nitride protective membrane;

FIGS. 5a–5e are cross-sectional views which show the steps via which passivation is applied to the bottom of a contact hole in accordance with another aspect of the invention and wherein: FIG. 5a shows the formation of a $AlO_x$ natural oxide film in a Al-1%Si layer located at the bottom of a contact hole, FIG. 5b shows the removal of the $AlO_x$ film, FIG. 5c shows the upper surface of the wafer coated with a sulphur nitride protective layer using plasma disposal, FIG. 5d shows the removal of the protective layer by applying heat to the wafer, and FIG. 5e shows the formation of a W plug using a selective CVD technique.

DETAILED DESCRIPTION OF THE INVENTION

A detailed description of specific examples of the present invention will now be given with reference to the above mentioned drawings.

EXAMPLE 1

The first example of the present invention features a process wherein: a bimetal, an Al-1%Si layer, and a reflection inhibiting membrane which combine to form a aluminum type material interconnector layer lamination, are etched using a $BCl_3/Cl_2$ containing gas. Following this a gas containing a mixture $S_2F_2/H_2/N_2$ is used in the same etching device to develop a sulphur nitride type protective membrane over the surface of the wafer. After this, and immediately before the next fabrication operation, the wafer is heated to remove the protective sulphur nitride membrane.

This process will be described in detail with reference to FIGS. 1a–1d.

Figure 1A:
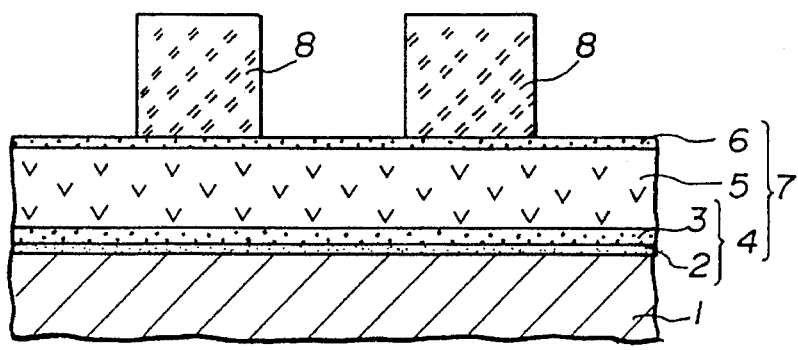

In the instant example, a wafer of the nature shown in FIG. 1a is used as an etching sample. This sample comprises a $SiO_2$ insulating substrate 1 which has a Ti layer 2 (approx 0.03 μm thick) and a TiON (titanium oxynitride) layer 3 (approx 0.08 μm thick) formed thereon. The Ti and the TiON layers cooperate to define a barrier metal 4. On top of this are a Al-1%Si layer 5 (approx 0.4 μm thick), a reflection inhibiting TiON membrane 6 (approx 0.03 μm thick). The barrier metal 4, the Al-1%Si and TiON layers cooperate to define a laminated aluminum type interconnector layer 7.

A predetermined pattern defining resist mask 8 (approx 1.0 μm thick) is formed on top of the laminated aluminum type interconnector layer 7. By way of example, this resist can be formed of a "Noboraku" type "Poji" form photo resist (Tokyo Ooka Industrial Company, article name TSMR-V3) and g line stepper pattern having width of approximately 0.5 μm.

The above wafer is then set on the wafer loading electrode in a RF bias impression type positive magnetic field micro wave plasma etching device. The wafer loading electrode includes a coolant conduit which is connected with an external cooling device such as a chiller, and is arranged to reduce the temperature of the wafer to below room temperature during the etching operation.

Etching of the laminar aluminum type interconnector layer 7 is carried out without cooling of the wafer and under the following conditions:

| | |
|---|---|
| $BCl_3$ flow rate | 60 SCCM |
| $Cl_2$ flow rate | 90 SCCM |
| G as pressure | 2.1 Pa (=16 m Torr) |
| Microwave power | 850 W (2.45 GHz) |
| RF bias power | 60 W (2 MHz) |

Figure 1B:
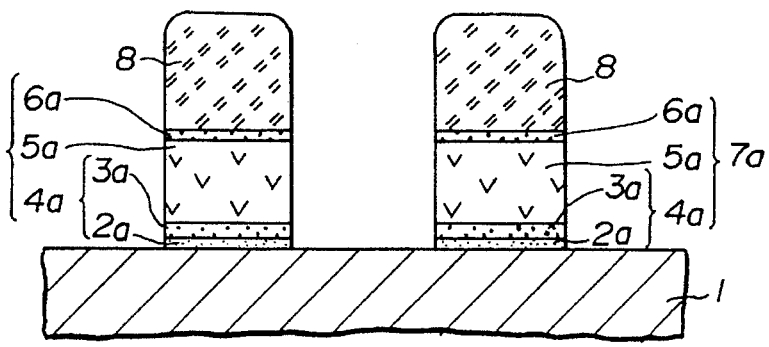
Figure 1C:
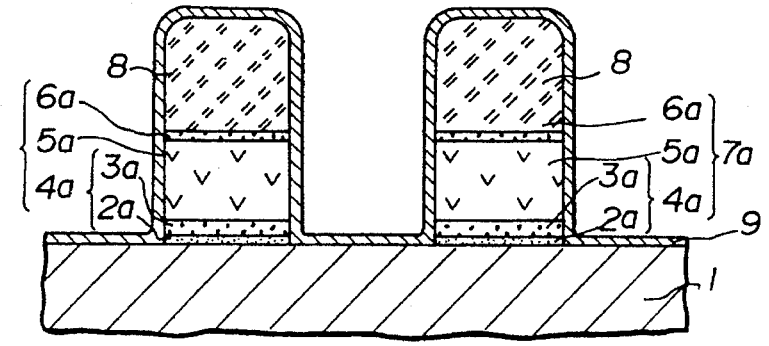
Figure 1D:
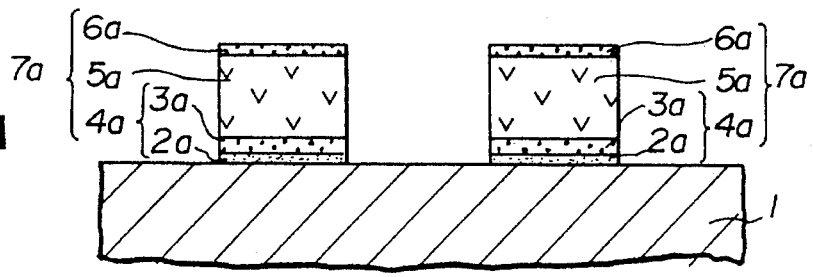

In this process in accordance with the Cl* radical reaction, $B^+$, $BCl_x^+$, $Cl_x^+$ etc., ions assist in the etching mechanism, and result in the Al type material laminar interconnector pattern 7a shown in FIG. 1b.

It should be noted in the drawings, the layers which have been modified will be denoted by the same numeral to which the letter "a" has been added In the state illustrated in the above mentioned FIG. 1b, if the various side wall portions of the layers which are etched, are left as they are and permitted to come into contact with the ambient atmospheric air, they will strongly tend to undergo what is referred to as "after corrosion". Therefore, while the wafer is still in the same RF bias impression type positive magnetic field micro wave plasma etching device, chilled ethanol is passed through the coolant conduit associated with the wafer loading electrode, and the following conditions induced.

| | |
|---|---|
| $S_2F_2$ flow rate | 20 SCCM |
| $H_2$ flow rate | 20 SCCM |

| | |
|---|---|
| $N_2$ flow rate | 20 SCCM |
| Gas pressure | 1.3 Pa (=10 m Torr) |
| Microwave power | 850 W (2.45 GHz) |
| RF bias power | 0 W |
| Wafer temperature | −20° C. |

With this the F* which is produced by the $H_2$ and $S_2F_2$ becomes hydrofluoric acid (HF) and induces a change wherein the S/F ratio increases and an atmosphere which is rich in S is generated.

During this plasma deposition process, the $S_2F_2$ disassociates into S and F which S then reacts with the $N_2$ gas to mainly form $(SN)_x$ Sulphur nitride material. By not impressing a bias under low temperature conditions, a thin layer accumulates on the surface of the wafer. The result of this is such as FIG. 1c, a thin $SN_x$ protective film 9 forms which is particularly stable with respect to water. Accordingly, the side walls and exposed surfaces of the Al type material laminar interconnector pattern 7a are prevented from coming into contact with moisture.

Further, during the reaction, the F* which is produced by the $S_2F_2$ substitutes with the residual chlorine.

The protective layer formed according to the above, was found to strongly inhibit after corrosion for a period of more than 48 hours.

It should be noted that during the plasma deposition, if the walls of the etching chamber are heated, deposits accumulate only on the wafer surface and the formation of particles elsewhere is effectively prevented.

The above mentioned protective $SN_x$ film 9 is such that if heated to 150° C. it readily decomposes or evaporates (sublimes) and can be easily removed. This results in the wafer surface being left free of unwanted $SN_x$ particle.

The above mentioned heating process can be carried out in a specially provided heating chamber or alternatively, a heating device carried on an extendible arm be moved into close proximity of the wafer, if so desired.

If the resist mask 8 is removed using normal $O_2$ plasma ashing, after corrosion is prevented and Al type laminar interconnector layer 7a is obtained in exactly the same condition as that which existed immediately after the etching operation.

It should also be noted that the $SN_x$ layer and the ashing of the resist mask 8 can be carried out at the same time. In this instance, the heat induced decomposition or sublimation of the $SN_x$ layer permits simultaneous removal in the presence of the combustion reaction.

After this, substratum insulation membrane or the like can be formed using normal fabrication techniques.

EXAMPLE 2

In this second example a different technique for applying passivation to an Al type laminar interconnector pattern is disclosed and features a process wherein a bimetal, a Al-1%Si layer, and a reflection preventing membrane which combine to form an aluminum interconnector layer lamination, are etched using a $BCl_3/Cl_2$ containing gas; treated with a gas containing a mixture of $O_2/N_2$ to remove the resist mask; and then treated with a gas containing a mixture of $S_2F_2/H_2/N_2$ to develop a protective $SN_x$ layer over the upper surface of the wafer. Immediately prior the next fabrication step, the $SN_x$ layer is removed via heating.

This process will be described with reference to FIGS. 2a–2d. Note should be made the elements depicted in these figures which are common to the arrangement depicted in FIGS. 1a–1d are denoted by the same numerals.

In this example the etching sample is the same as the wafer depicted in FIG. 1a. The etching sample is set in an etching chamber of a magnetron RIE device, and the Al type laminar interconnector layer 7 is etched under the following conditions.

| | |
|---|---|
| $BCl_3$ flow rate | 60 SCCM |
| $Cl_2$ flow rate | 90 SCCM |
| Gas pressure | 4 Pa (=30 m Torr) |
| RE power | 1 kW (13.56 MHz) |

The effect of this (shown in FIG. 2a) results in the formation of a Al type laminar interconnector pattern 7a. This condition is the same as that shown in FIG. 1b.

Following this, the wafer is transferred within the above mentioned magnetron RIE device to a microwave downstream type ashing device which is disposed therewith. In this chamber the resist mask 8 is removed under the following conditions.

| | |
|---|---|
| $O_2$ flow rate | 2000 SCCM |
| $N_2$ flow rate | 50 SCCM |
| Gas Pressure | 40 Pa (=300 m Torr) |
| Microwave power | 1 kW (2.45 GHz) |
| Wafer temp. | 200° C. |

Figure 2A:
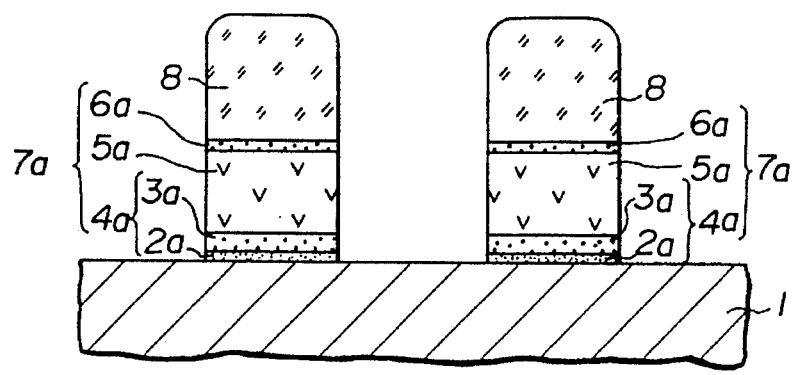
Figure 2B:
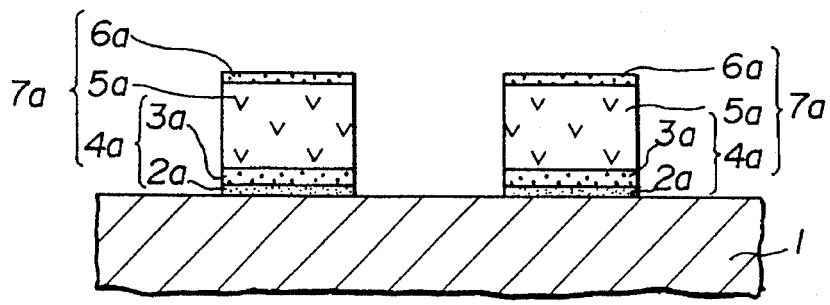

This results in a wafer having a Al type laminar interconnector pattern 7a of the nature depicted in FIG. 2b, being produced.

In comparison with the arrangement depicted in FIG. 2a, the removal of the resist mask 8 is such as to induce a situation wherein the sites where occlusion of chlorine can occur is increased and the chances of after corrosion increased. However, as the sections of the modified layers which are in contact, are exposed, there is still the concern that the residual chlorine which is included therein will bring about after corrosion. Accordingly, the wafer is returned to the etching chamber and subject to plasma deposition under the following conditions.

| | |
|---|---|
| $S_2F_2$ flow rate | 20 SCCM |
| $H_2$ flow rate | 20 SCCM |
| $N_2$ flow rate | 20 SCCM |
| Gas pressure | 1.3 Pa (=10 m Torr) |
| RF power | 400 W (13.56 MHz) |
| Wafer temp. | −20° C. |

Figure 2C:
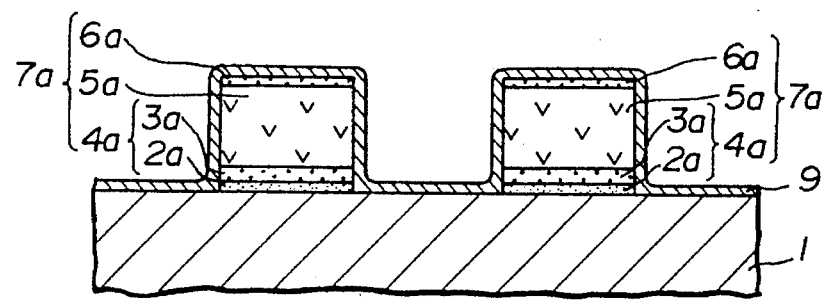

In accordance with this plasma deposition, a thin $SN_x$ protective membrane 9 accumulates on the surface of the wafer in the manner illustrated in FIG. 2c.

This thin protective layer was found to be such that even when the wafer was exposed to the ambient atmosphere for more than 72 hours no after corrosion was observed.

Figure 2D:
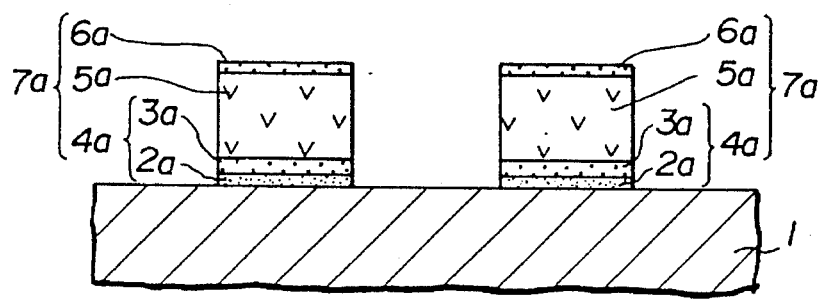

If the above mentioned protective membrane 9 is heated to 150° C. immediately prior the next fabrication operation, the membrane is readily disassociated or sublimed and thus enables the arrangement depicted in FIG. 2d to be obtained. The effect of this is that the desired laminar connection pattern is maintained in exactly the desired state which existed immediately after the etching process. Further, all undesirable particulate residue is removed.

Following this, the formation of a substratum insulation layer or the like type of normal fabrication processes can be carried out.

EXAMPLE 3

In this example passivation is applied to the bottom of a contact hole which extends to silicon substrate in which a doped zone has been formed and on which zone a membrane of $SiO_2$ has formed by way of natural oxidation. This process, which is illustrated in FIGS. 3a to 3e is such that the natural oxide film is removed using a gas containing a mixture of $S_2F_2/H_2$. The wafer is then exposed to a gas containing a mixture of $S_2F_2/H_2/N_2$ which is used to induce a thin protective membrane to accumulate on the surface thereof. The protective membrane is then removed via heating and a (W) plug formed formed using a selective CVD technique.

Figure 3A:
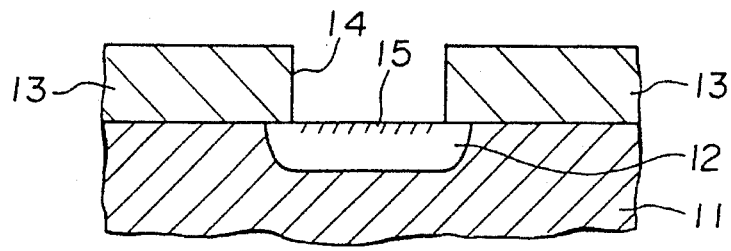

More specifically, the instant example is applied to a wafer of the nature shown in FIG. 3a. That is to say, a doped region 12 which is used as a substratum interconnector material layer is formed in a silicon substrate 11. A silicon oxide layer which is used as a substratum insulation membrane 13, is etched to form a contact hole 14 which extends to the doped region 12. The just mentioned etching is carried out using a magnetron RIE (reaction ion etching) type device using a $C_4F_8$ flow rate of 50 SCCM, a gas pressure of 2 Pa, and a RF power of 600 W (13.56 MHz). During resist mask ashing in an $O_2$ plasma, the surface of the doped region 12 which is exposed at the bottom of the contact hole 14 undergoes natural oxidation and the $SiO_2$ film 15 is formed.

In order to remove this $SiO_2$ film, the wafer is set on the wafer loading electrode in a RF bias impression type positive magnetic field micro wave plasma etching device and etched under the following conditions.

| $S_2F_2$ flow rate | 10 SCCM |
| --- | --- |
| $H_2$ flow rate | 50 SCCM |
| Gas pressure | 1.3 Pa (=10 m Torr) |
| Microwave power | 850 W (2.45 GHz) |
| RF bias power | 5 W (13.56 MHZ) |
| Wafer temp. | −70° C. (using cold ethanol) |

In accordance with the microwave discharge, the F* radical which is derived from the disassociation of $S_2F_2$ removes the $SiO_2$ layer and at the same time, a competing effect wherein the S which is derived from the disassociation of $S_2F_2$ accumulates on the etched surfaces. However, as the etching gas is largely enriched with $H_2$, the F* radical tends to form HF and to be removed from the reaction. Accordingly, the etching reaction is extremely mild and no undercut formation occurs at the silicon substrate 11.

Figure 3B:
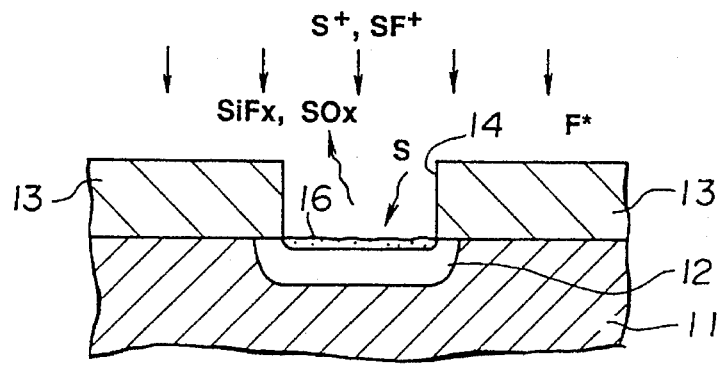

The result of the etching is shown in FIG. 3b and is such that the natural oxide $SiO_2$ film or membrane 15 is removed and at the same time a S protective layer 16 is formed over the doped region 12.

Following this, in the same etching device plasma deposition is carried out under the following conditions.

| $S_2F_2$ flow rate | 10 SCCM |
| --- | --- |
| $H_2$ flow rate | 5 SCCM |
| $N_2$ flow rate | 10 SCCM |
| Gas pressure | 1.3 Pa (=10 m Torr) |
| Microwave power | 850 W (2.45 GHz) |
| RF bias power | 0 W |
| Wafer temp. | −20° C. |

Figure 3C:
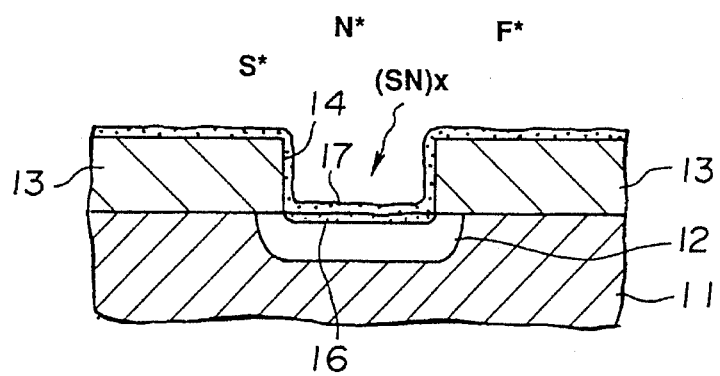

During this plasma deposition process, the S and $N_2$ which are derived from the disassociation of the $S_2F_2$, react to mainly form $(SN)_x$ and, in the absence of a bias impression and under the reduced temperature conditions, the surface of the wafer becomes coated. The effect of this is depicted in FIG. 3c, wherein the upper surface of the wafer is covered in thin film of Sulphur nitride 17, as shown.

This $SN_x$ protective layer 17 is particular stable in the presence of $O_2$ and as such the doped region is sealed off and the formation of a $SiO_2$ layer is prevented.

Figure 3D:
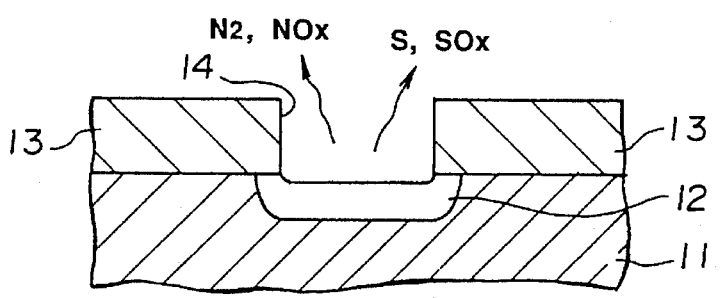

Following the above, the wafer is transferred to a CVD device and placed on a wafer stage. The wafer is then exposed to a halogen lamp and heated to approximately 150° C. This induces the protective layers 16 and 17 to decompose and/or sublime into $N_2$, $NO_x$, S and $SO_x$. The effect of this is depicted in FIG. 3d wherein, as shown, the contact hole is left completely clean and so that the exposed surface of the doped region is free of any $SiO_x$ type natural oxide film. At this time the wafer is also free of particulate deposits.

Next, the contact hole 14 has a W plug formed therein using a normal pressure CVD technique under the following conditions.

| $WF_6$ flow rate | 10 SCCM |
| --- | --- |
| $H_2$ flow rate | 1000 SCCM |
| $SiH_4$ flow rate | 7 SCCM |
| Wafer temp. | 260° C. |

Figure 3E:
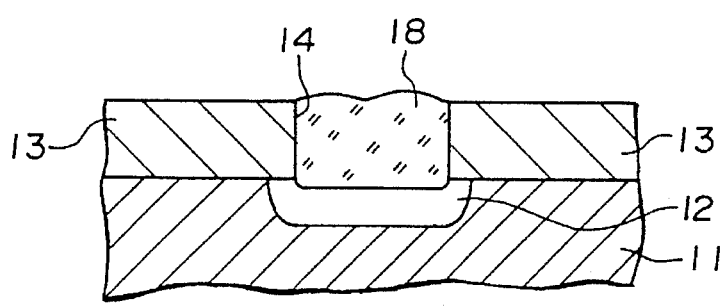

This fabrication step fills the contact hole with a W plug 18 in the manner illustrated in FIG. 3e.

The above process is such as to prevent the reformation of a natural oxide layer on the surface of the doped region 12 which is exposed at the bottom of the contact hole via the formation of the protective layers 16 and 17 and thus enable the desired contact to be established between the doped layer and the plug 18 upon the formation of the latter.

EXAMPLE 4

In this example of the invention shows another technique via which passivation can be applied to the surface of a doped region located at the bottom of a contact hole. This process, which is illustrated in FIGS. 4a and 4b, is such that the natural oxide layer which forms on the exposed surface of the doped region, is removed while at the same time a protective sulphur nitride layer is formed via the use of a gas which contains a mixture of $HF/S_2F_2/H_2/N_2$.

Figure 4A:
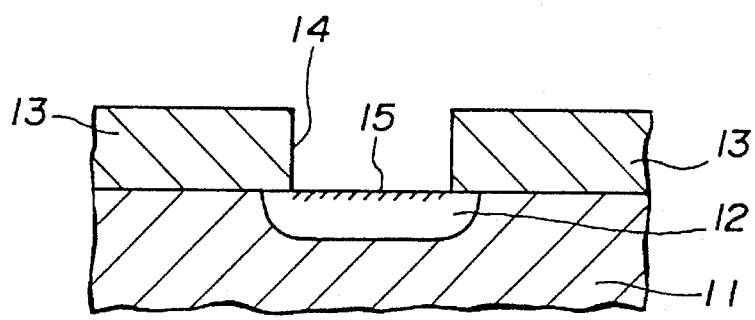
Figure 4B:
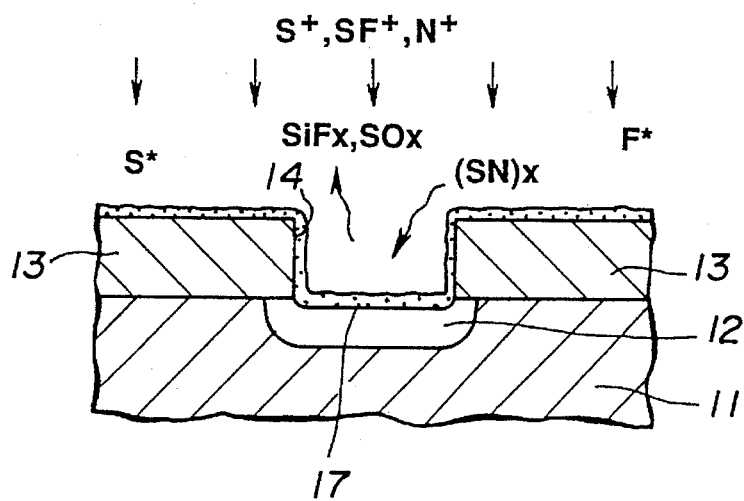

It will be noted that the elements shown in FIGS. 4a and 4b are denoted by the same numerals as used in connection with FIGS. 3a–3e.

In this instance the wafer which is used as a sample is the same as that illustrated in FIG. 4a and is placed in a RF bias impression type positive magnetic field micro wave plasma etching device and then etched under the following conditions.

| HF flow rate | 20 SCCM |
| --- | --- |
| $S_2F_2$ flow rate | 10 SCCM |
| $H_2$ flow rate | 20 SCCM |
| $N_2$ flow rate | 20 SCCM |
| Gas pressure | 1.3 Pa (=10 m Torr) |
| Microwave power | 850 W (2.45 GHz) |
| RF bias power | 5 W (2 MHz) |
| Wafer temp. | 25° C. |

In this process the $(SN)_x$ which mainly originates from the $S_2F_2$ and the $N_2$ forms a protective sulphur nitride layer 17 while the F* radical which is released by the HF removes the naturally formed silicon oxide layer $SiO_2$. The effect of this is the arrangement shown in FIG. 4a is transformed into that shown in FIG. 4b. That is to say, the $SiO_2$ layer 15 which is shown in FIG. 4a is removed and a protective sulphur nitride layer 17 is formed over the surface of the wafer directly thereafter.

It should be noted that event thought the composition of the gas is such that the HF and the $S_2F_2$ act as source of the F* radical, consideration is given to the discharge disassociation efficiency so that the $S_2F_2$ acts mainly as a source of S and the HF conventionally acts a source of F*.

Following the above, the wafer can be heated in a CVD device in the same manner as in the case of example 3, to remove the protective sulphur nitride layer 17 and enable the formation of a W plug in the same manner as disclosed in connection with FIG. 3e.

EXAMPLE 5

In this example of the invention, passivation is applied to the bottom of a bore hole which is formed through to a Al-1%Si layer, the surface of which is contaminated with a natural oxide layer of $AlO_x$. The process which characterizes this embodiment of the invention is depicted in FIGS. 5a–5e and is such that the $AlO_x$ layer is removed using $BCl_3$ and thereafter the wafer is treated with a gas which contains a mixture of $S_2Cl_2/H_2/N_2$ to form a protective sulphur nitride film. This film is then removed by heating and the W plug formed using a selective CVD technique.

Figure 5A:
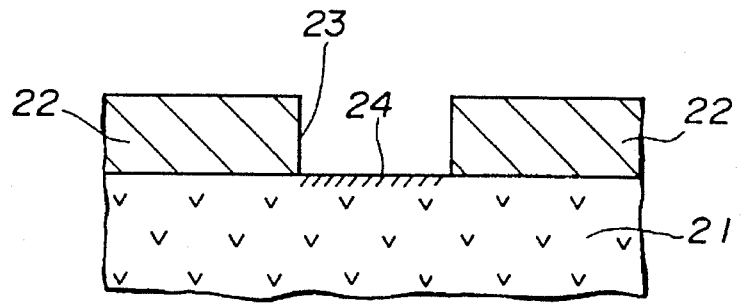
Figure 5B:
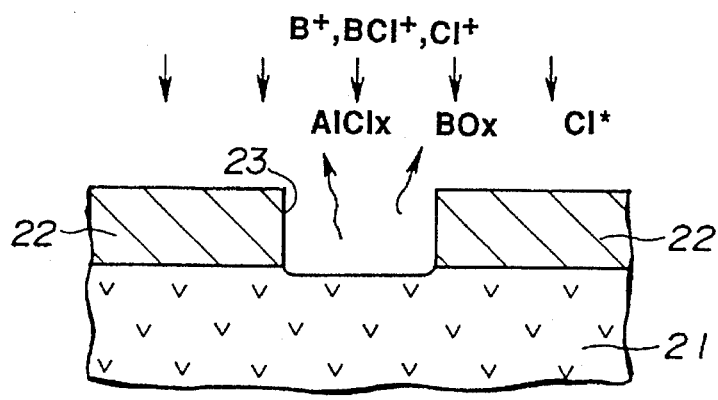

In this example, the sample which is used is a wafer which, as shown in FIG. 5a, comprises a substratum interconnector layer 21 of Al-%Si on which a silicon oxide interlayer insulation membrane 22 is formed. A bore hole 23 is formed in the interlayer insulation membrane 22. The surface of the Al-%Si layer 21 which is exposed at the bottom of the bore hole 23, has a natural oxide ($AlO_x$) film 24 formed thereon.

This sample is placed on a RF bias impression type positive magnetic field micro wave plasma etching device wherein it is subject to etching under the following conditions.

| | |
|---|---|
| $BCl_3$ flow rate | 50 SCCM |
| Gas pressure | 1.3 Pa (=10 Torr) |
| Microwave power | 850 W (2.45 GHz) |
| RF bias power | 50 W (2 MHz) |

This etching is such that the $BCl_3$ is used for its restoration properties and is such that it reacts with the $AlO_x$ to form $AlCl_x$ and $BO_x$ and thus removes the natural oxide membrane.

Following this, and in the same etching device, plasma deposition is carried out under the following conditions.

| | |
|---|---|
| $S_2C_2$ flow rate | 10 SCCM |
| $H_2$ flow rate | 5 SCCM |
| $N_2$ flow rate | 10 SCCM |
| Gas pressure | 1.3 Pa (=10 m Torr) |
| Microwave power | 850 W (2.45 GHz) |
| RE bias power | 0 W |
| Wafer temp. | 20° C. |

Figure 5C:
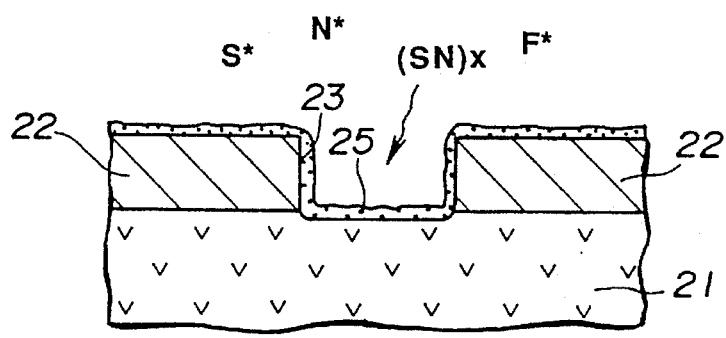

During this plasma deposition process the S and $N_2$ which are derived from the disassociation of the $S_2F_2$, react to mainly form $(SN)_x$ and in the absence of a bias impression and under the reduced temperature conditions, the surface of the wafer becomes coated. The effect of this is shown in FIG. 5c. Viz., the surface of the wafer becomes covered in thin protective film 25.

Figure 5D:
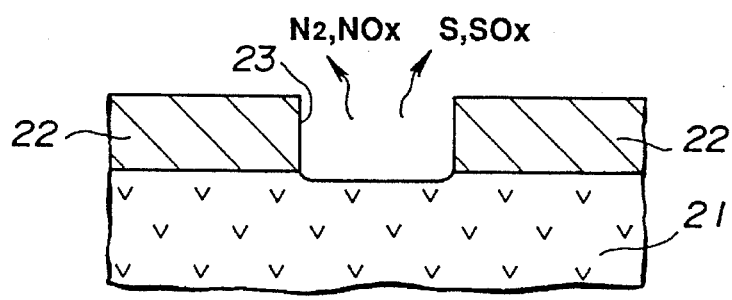
Figure 5E:
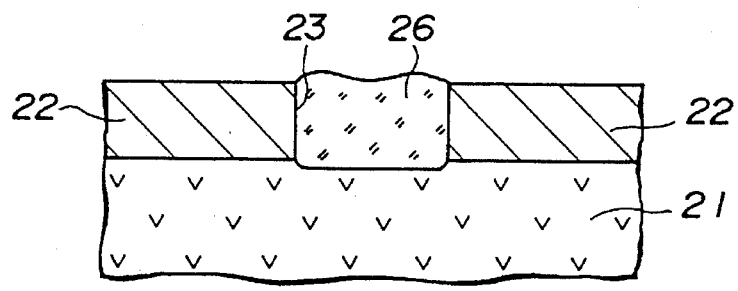

Following the above, the wafer is transferred to a CVD device and placed on a wafer stage. The wafer is then exposed to a halogen lamp and heated to approximately 150° C. This induces the protective layers 16 and 17 to decompose and/or sublime into $N_2$, $NO_x$, S and $SO_x$. The effect of this is depicted in FIG. 5d wherein, as shown, the contact hole is left completely clean and so that the exposed surface of the doped region is free of $SiO_x$ type natural oxide films. At this time the rest of the wafer is rendered free of particulate deposits.

Next, the contact hole 14 has a W plug 26 formed therein using a normal pressure CVD technique in the same manner as disclosed in connection with example 3.

It will of course be understood that the present invention is not limited to the above five examples.

For example, in connection with the passivation of the Al type laminar interconnector pattern, sulphur-fluoro materials other than $S_2F_2$ can be used to provide essentially the same effect. The invention is not limited to the use of the F* radical as a replacement for the residual halogens and it is within the scope of the same to employ the H* radical in its place. Of course other suitable sources of S can be used and the invention is not limited to the use of $S_2F_2$ and $S_2Cl_2$ and suitable other materials can be used with essentially the same effect.

In connection with nitrogen containing materials, apart from the above mentioned $N_2$ it is possible to use $NF_3$. The use of $NH_3$ is not desirable in that it reacts with S and gives rise the possible formation of ammonium sulfide.

In order to form sulphur nitride, it is necessary to form a gas wherein the S/X ratio is increased via the addition of some ingredient. To this end as an alternative to hydrogen it is possible to use $H_2S$ and the like type of materials.

Further, in connection with the etching gas and the materials used to form the sulphur nitride layers, it is not objectionable to additionally use cooling, spattering and dilution techniques in addition to varying the gas mixture using inert gases such as helium and argon.

Moreover, it is also possible to suitably combine other known techniques for preventing after corrosion caused by fluorine replacement and washing, and apply the same in combination with the use of sulphur nitride layers in order to improve the passivation of Al type material laminar interconnector patterns.

What is claimed is:

1. A method of forming interconnectors comprising the steps of:

forming an aluminum interconnector pattern by forming an interconnector layer containing aluminum on a substrate, resist masking and etching the interconnector layer;

maintaining the substrate under high vacuum and at a temperature below room temperature, and forming a sulphur nitride material layer on at least the exposed portions of the interconnector pattern; and removing the sulphur nitride material layer before a next fabrication process.

2. A method of forming interconnectors as set forth in claim 1 wherein said sulphur nitride layer is formed using a gas which contains a sulphur compound and nitrogen compound and a plasma CVD technique wherein discharge disassociation produces a plasma wherein the sulphur nitride material of the layer is formed, and wherein the sulphur compound contained in the gas includes at least one compound of $S_2F_2$, $SF_2$, $SF_4$, $S_2F_{10}$ and $H_2S$.

3. A method of forming interconnectors as set forth in claim 1 wherein said sulphur nitride material is essentially formed from a polythiazyl.

4. A method of forming interconnectors as set forth in claim 1 wherein said interconnector layer comprises a laminar of:
   a barrier metal layer,
   an Al layer, and
   a reflection preventing layer.

5. A method of forming interconnectors as set forth in claim 1 wherein said next fabrication step comprises a step of forming an interlayer insulation membrane.

6. A method of forming interconnectors as set forth in claim 1 wherein said step of removing said sulphur nitride material layer comprises heating the substrate.

7. A method of forming interconnectors as set forth in claim 1, wherein the step of removing said sulphur nitride material layer is carried out using plasma ashing and is carried out at the same time as removing a resist mask, which is used to mask the interconnector layer.

8. A method of forming an interconnector comprising the steps of:
   forming an aluminum interconnector pattern by forming a lamination of a barrier metal layer, an aluminum material layer, and a reflection preventing layer on an insulating substrate, and then resist masking and etching the lamination;
   forming a sulphur nitride layer on at least the exposed surfaces of the aluminum interconnector pattern by maintaining the substrate under a high vacuum and at a temperature which is below room temperature, and using a plasma CVD technique wherein a gas contains a mixture of a sulphur containing compound and a nitrogen containing compound and wherein the sulphur containing compound is selected from at least one compound of $S_2F_2$, $SF_2$, $SF_4$, $S_2F_{10}$ and $H_2S$; and
   removing the sulphur nitride layer by heating the substrate before forming a interlayer insulation membrane.

9. A method of forming an interconnector as set forth in claim 8 wherein said aluminum material comprises an alloy of aluminum and silicon, wherein said barrier metal is formed of Ti and said reflection preventing layer is formed of titanium oxynitride.

10. A method of forming an interconnector comprising the steps of:
    forming an aluminum interconnector pattern by resist masking and etching an interconnector layer which contains aluminum and is formed on a substrate;
    reducing the temperature of the substrate to a level which is below room temperature and coating at least the exposed surfaces of the aluminum interconnector pattern with a sulphur nitride layer; and
    removing said sulphur nitride layer prior to a the next fabrication step.

11. A method of forming interconnectors as set forth in claim 10 wherein said sulphur nitride layer is formed using a plasma CVD technique wherein discharge disassociation in a gas, which contains a sulphur based compound and nitrogen based compound, produces a plasma wherein the sulphur nitride material of the layer is formed, and wherein the sulphur based compound contained in the gas is at least one compound of $S_2F_2$, $SF_2$, $SF_4$, $S_2F_{10}$ and $H_2S$.

12. A method of forming interconnectors as set forth in claim 10 wherein said sulphur nitride layer is essentially a polythiazyl.

13. A method of forming interconnectors as set forth in claim 10 wherein said interconnector layer comprises a lamination of a barrier metal layer, an aluminum material layer, and a reflection preventing layer.

14. A method of forming interconnectors as set forth in claim 10 wherein said next fabrication step comprises a step of forming interlayer insulation membrane.

15. A method of forming interconnectors as set forth in claim 10 wherein said step of removing said sulphur nitride layer comprises heating the substrate.

16. A method of forming interconnectors comprising:
    forming an aluminum interconnector pattern by resist masking and etching a interconnector layer which contains aluminum and is formed on an insulating substrate;
    removing the resist mask by plasma etching;
    reducing the temperature of the substrate below room temperature and forming a sulphur nitride layer on at least the exposed surfaces of said aluminum interconnector pattern using a plasma CVD technique and a gas which contains a sulphur based compound including at least one compound of $S_2F_2$, $SF_2$, $SF_4$, $S_2F_{10}$ and $H_2S$, and nitrogen based compound, to produce a sulphur nitride material comprising polythiazyl; and
    removing the sulphur nitride layer immediately prior the formation of a interlayer insulation membrane.

17. A method of forming an interconnector as set forth in claim 16 wherein said aluminum material interconnector layer comprises a layer of barrier metal, a reflection preventing layer and an alloy of aluminum and silicon, wherein said barrier metal is formed of Ti and said reflection preventing layer is formed of titanium oxynitride.

18. A method of forming an interconnector comprising the steps of:
    forming a connection hole in a insulation membrane formed on top of a substratum interconnector layer which substratum interconnector layer is formed on a substrate;
    removing a natural oxide film which is formed on the surface of the substratum interconnector layer exposed at the bottom of said connection hole;
    forming a sulphur nitride layer over at least a lower exposed surface of said connection hole while maintaining the substrate under high vacuum and at a temperature which is lower than room temperature;
    removing the sulphur nitride layer;
    filling the connection hole by forming an upper interconnector material layer while maintaining the substrate under high vacuum.

19. A method of forming interconnectors as set forth in claim 18 wherein said sulphur nitride layer is formed using a gas which contains a sulphur compound and nitrogen compound and a plasma CVD technique wherein discharge disassociation produces a plasma wherein the sulphur nitride material of the layer is formed, and wherein the sulphur compound contained in the gas includes at least one compound of $S_2F_2$, $SF_2$, $SF_4$, $S_2F_{10}$, $S_3Cl_2$, $S_2Cl_2$, $SCl_2$, $S_3Br_3$, $SBr_3$ and $H_2S$.

20. A method of forming interconnectors as set forth in claim 18 wherein said sulphur nitride layer comprises a polythiazyl.

21. A method of forming interconnectors as set forth in claim 18 wherein said substratum interconnector layer comprises a doped region formed in a silicon substrate and wherein said natural oxide film comprises silicon oxide.

22. A method of forming interconnectors as set forth in claim 18 wherein said substratum interconnector layer comprises an aluminum material layer and the natural oxide film comprises aluminum oxide.

23. A method of forming interconnectors as set forth in claim 18 wherein the removal of said sulphur nitride layer is effected by heating the substrate.

24. A method of forming interconnectors comprising the steps of:

forming a connection hole in a insulation membrane formed on top of a substratum interconnector layer which substratum interconnector layer is formed on a substrate;

removing a natural oxide film which is formed on the surface of the substratum interconnector layer exposed at the bottom of said connection hole;

reducing the temperature of the substrate below room temperature and forming a sulphur nitride layer on at least the exposed lower surfaces of said connection hole using a plasma CVD technique and a gas which contains a sulphur based compound including at least one compound of $S_2F_2$, $SF_2$, $SF_4$, $S_2F_{10}$, $S_3Cl_2$, $S_2Cl_2$, $SCl_2$, $S_3Br_3$, $SBr_3$ and $H_2S$, and a nitrogen based compound, to produce a sulphur nitride material comprising polythiazyl, removing the sulphur nitride layer by heating the substrate; and filling the connection hole by forming an upper interconnector material layer while maintaining the substrate under high vacuum.

25. A method of forming interconnectors as set forth in claim 24 wherein said upper interconnector material layer comprises tungsten.

26. A method of forming interconnectors comprising the steps of:

forming a connection hole in a insulation membrane formed on top of a substratum interconnector layer which substratum interconnector layer is formed on a substrate;

maintaining the substrate under high vacuum and at a temperature which is lower than room temperature while removing a natural oxide film which is formed on the surface of the substratum interconnector layer exposed at the bottom of said connection hole, and forming a sulphur nitride layer over at least an exposed lower surface of said connection hole;

removing the sulphur nitride layer; and then filling the connection hole by forming an upper interconnector material layer while maintaining the substrate under high vacuum.

27. A method of forming interconnectors as set forth in claim 26 wherein the formation of said sulphur nitride layer is carried out using a plasma CVD technique and using a gas which contains a sulphur compound including at least one compound of $S_2F_2$, $SF_2$, $SF_4$, $S_2F_{10}$, $S_3Cl_2$, $S_2Cl_2$, $SCl_2$, $S_3Br_3$, $SBr_3$ and $H_2S$, and a nitrogen based compound, and wherein the sulphur nitride layer is produced in a plasma produced under electrical discharge disassociation conditions.

28. A method of forming interconnectors as set forth in claim 26 wherein the sulphur nitride layer is composed of polythiazyl.

29. A method of forming interconnectors as set forth in claim 26 wherein said substratum interconnector layer comprises a doped region formed in a silicon substrate and wherein said natural oxide film comprises silicon oxide.

30. A method of forming interconnectors as set forth in claim 26 wherein said substratum interconnector layer comprises an aluminum material layer and the natural oxide film comprises aluminum oxide.

31. A method of forming interconnectors as set forth in claim 26 wherein said step of removing said sulphur nitride layer comprises heating the substrate.

32. A method of forming interconnectors comprising the steps of:

forming a connection hole in a insulation membrane formed on top of a substratum interconnector layer which substratum interconnector layer is formed on a substrate;

maintaining the substrate under high vacuum and at a temperature which is below room temperature, and removing a natural oxide film on the surface of the substratum interconnector layer which is exposed at the bottom of said connection hole, while forming a sulphur nitride layer comprising polythiazyl on at least the exposed lower surfaces of said connection hole using a gas which contains a sulphur based compound including at least one compound of $S_2F_2$, $SF_2$, $SF_4$, $S_2F_{10}$, $S_3Cl_2$, $S_2Cl_2$, $SCl_2$, $S_3Br_3$, $SBr_3$ and $H_2S$, and a nitrogen based compound;

removing the sulphur nitride layer by heating the substrate; and then filling the connection hole by forming an upper interconnector material layer while maintaining the substrate under high vacuum.

33. A method of forming interconnectors as set forth in claim 32 wherein said upper interconnector material layer comprises tungsten.

* * * * *